United States Patent
Urashima et al.

(10) Patent No.: US 7,388,296 B2
(45) Date of Patent: Jun. 17, 2008

(54) WIRING SUBSTRATE AND BONDING PAD COMPOSITION

(75) Inventors: Kazuhiro Urashima, Aichiken (JP); Tatsuharu Ikawa, Aichiken (JP); Mitsuo Shiraishi, Aichiken (JP); Hiroshi Sumi, Aichiken (JP)

(73) Assignee: NGK Spark Plug Co., Ltd., Mizuho-ku, Nagoya (JP)

( * ) Notice: Subject to any disclaimer, the term of this patent is extended or adjusted under 35 U.S.C. 154(b) by 61 days.

(21) Appl. No.: 11/449,107

(22) Filed: Jun. 8, 2006

(65) Prior Publication Data
US 2006/0280919 A1    Dec. 14, 2006

(30) Foreign Application Priority Data
Jun. 9, 2005  (JP) .............................. 2005-169302

(51) Int. Cl.
*H01L 23/48*   (2006.01)
*H05K 1/09*    (2006.01)

(52) U.S. Cl. ...................... 257/779; 257/772; 174/257; 174/267

(58) Field of Classification Search ................ 257/741, 257/772, 779; 174/257, 259, 267
See application file for complete search history.

(56) References Cited

U.S. PATENT DOCUMENTS

| | | | | |
|---|---|---|---|---|
| 4,865,772 A | * | 9/1989 | Suehiro et al. ............. | 252/512 |
| 5,035,837 A | * | 7/1991 | Saeki et al. ................. | 252/512 |
| 5,174,925 A | * | 12/1992 | Fujii et al. .................. | 252/514 |
| 5,336,301 A | * | 8/1994 | Tani et al. .................. | 106/1.18 |
| 5,418,193 A | * | 5/1995 | Tani et al. ..................... | 501/19 |
| 5,731,066 A | * | 3/1998 | Ando et al. ................. | 428/210 |
| 5,917,707 A | * | 6/1999 | Khandros et al. ........... | 361/776 |
| 6,200,889 B1 | * | 3/2001 | Rolfson ...................... | 438/612 |
| 6,329,722 B1 | * | 12/2001 | Shih et al. ................... | 257/786 |
| 6,339,257 B1 | * | 1/2002 | Fujiki et al. ................. | 257/751 |
| 7,157,023 B2 | * | 1/2007 | Mears ......................... | 252/514 |
| 7,182,672 B2 | * | 2/2007 | Tunaboylu et al. ........... | 451/36 |

FOREIGN PATENT DOCUMENTS

| | | |
|---|---|---|
| JP | 6-56545 | 3/1994 |
| JP | 8-125341 | 5/1996 |
| JP | 8-181441 | 7/1996 |

* cited by examiner

*Primary Examiner*—Cathy F. Lam
(74) *Attorney, Agent, or Firm*—Kusner & Jaffe

(57) ABSTRACT

A wiring substrate comprised of a substrate main body made of glass-ceramic, a pad formed on a surface of the substrate main body and a conductor pin provided in an upright position on the pad. The pad is comprised of a ceramic that is the same as the ceramic constituting the glass-ceramic, Fe converted into $Fe_2O_3$ and Cu. The $Fe_2O_3$ comprises 1 to 28 parts by weight with respect to 100 parts by weight of the Cu.

8 Claims, 5 Drawing Sheets

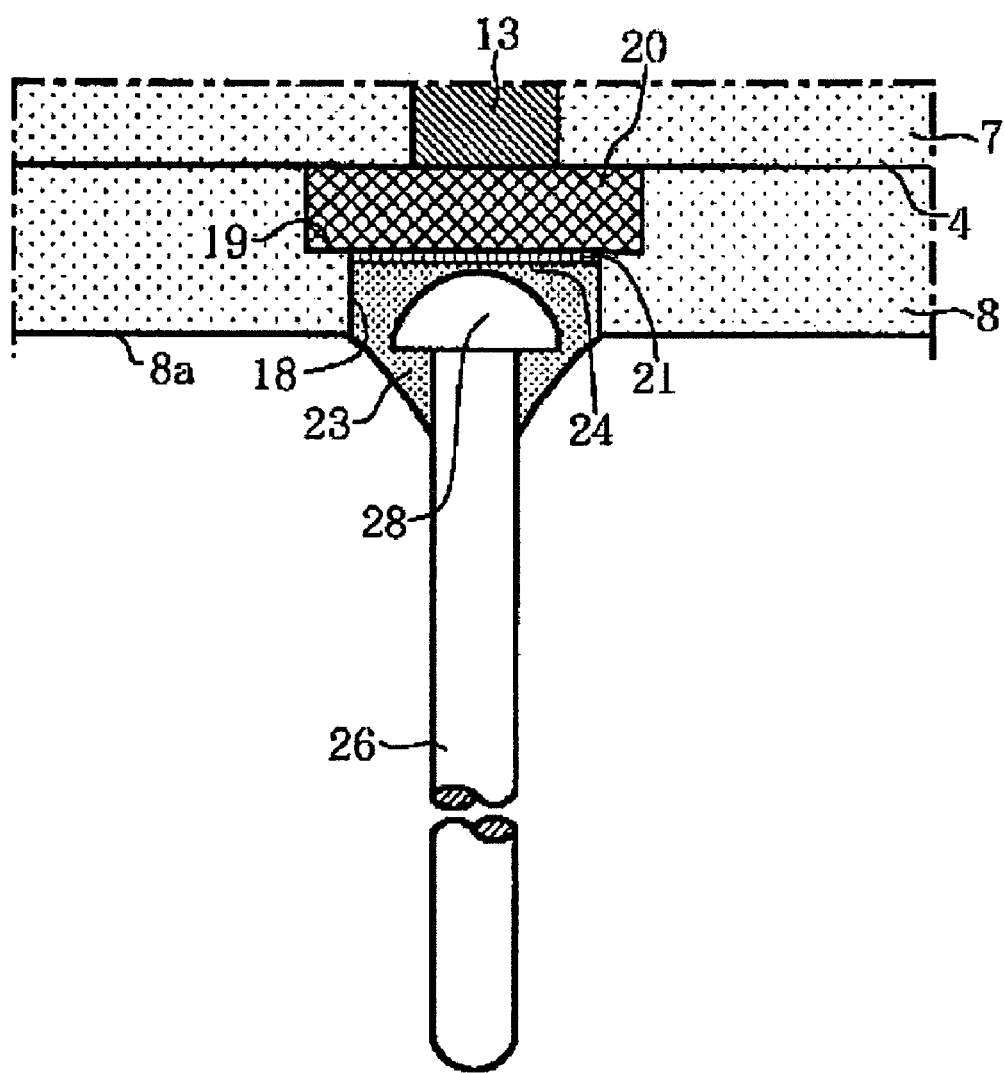

WIRING SUBSTRATE AND BONDING PAD COMPOSITION

FIELD OF THE INVENTION

The present invention relates to a wiring substrate including a conductor pin soldered on a pad formed on at least one of the front surface and the back surface of a substrate main body made of glass-ceramic.

BACKGROUND OF THE INVENTION

A wiring substrate including a substrate main body made of low dielectric loss glass-ceramic, and a low-resistant Cu-based metal pad formed on at least one of the front surface and the back surface of the substrate main body is especially preferable for mounting thereon an electronic part which is used in high-frequency region.

Further, by soldering a conductor pin to the pad made of Cu-based metal, the resultant wiring substrate can be widely used, for example, for mounting MPU thereon and, in the optical communication field and the like, for mounting optical communication elements thereon.

On the other hand, there is suggested a metal-containing paste composition composed of a conductive first metal (for example, copper), an oxidizable second metal (for example, iron), and an organic medium, and a method for sintering the same. This metal-containing paste composition has a volume shrinking rate similar to that of glass-ceramic, and exhibits enhanced adhesion to the glass-ceramic. (See, for example, U.S. Letters Pat. No. 5,336,444).

Further, there is also suggested an electronic circuit apparatus in which a wiring conductor made of Cu-based metal and a joint electrode are formed on a substrate material made of glass-ceramic, and an Au—Ni protective film is formed on the joint electrode, and electronic parts and input/output pins are bonded on the protective film via a Au—Sn-based brazing material and the like. (See, for example, U.S. Letters Patent No. 5,731,066).

By the way, there is a case where the joint electrode (pad) made of the Cu-based metal of U.S. Pat. No. 5,731,066 is formed on the surface of the substrate main body made of glass-ceramic using the metal (copper)-containing paste composition of Patent Document 1, and a conductor pin made of copper alloy is bonded onto thus-formed electrode via Sn—Sb-based alloy soldering and the like.

However, when an external force is applied to the conductor pin along a substantially axial direction, crack generates on the interface between the electrode and the glass-ceramic material. As a result, there may arise a case where the solder, said electrode, and the glass-ceramic material adjacent to this electrode peel off from the substrate main body together with said conductor pin. For this reason, a problem arises that conduction cannot be established between the internal wiring of the wiring substrate, and the relay board and the mother board via the conductor pin.

The present invention overcomes these and other problems and provides a wiring substrate which exhibits enhanced adhesion between a substrate main body made of glass-ceramic and a pad formed thereon, and exhibits enhanced joint strength of a conductor pin which is soldered to the pad.

SUMMARY OF THE INVENTION

The present invention has been made by conceiving that pads each containing metal and ceramic in predetermined amounts are present on the glass-ceramic surface of the substrate main body, and conductor pins are bonded on the pads via solder.

Specifically, a wiring substrate of the first aspect of the present invention includes:

a substrate main body made of glass-ceramic and having a front surface and a back surface;

a pad formed on at least one of the front surface and the back surface of said substrate main body; and a conductor pin provided in an upright position on said pad via solder, wherein said pad is comprised of a ceramic that is the same as the ceramic constituting said glass-ceramic, Fe converted into $Fe_2O_3$, and Cu, said $Fe_2O_3$ comprising 1 to 28 parts by weight with respect to 100 parts by weight of said Cu.

According to this structure, said pad is comprised of the ceramic that is the same as the ceramic constituting said glass-ceramic, 1 to 28 parts by weight Fe converted into $Fe_2O_3$, and 100 parts by weight of Cu.

In this structure, the ceramic serves to establish chemical adhesion between the pads and the glass-ceramic of the substrate main body. Simultaneously, the differences in thermal expansions between said pads and the glass-ceramics are reduced, so that the sintering shrinking amount (i.e. the sintering shrinking rate) between the pads and the substrate main body can be made to be close to each other. Thus, the warping of the substrate main body can be assuredly suppressed.

Further, since iron oxide such as $Fe_2O_3$ diffuses within the substrate main body made of glass-ceramic, the adhesion between the glass component and said pads can be enhanced.

For this reason, when the solder on the pads and conductor pins are bonded via said solder, the stress remaining on the interface between the pads made of, for example, Sn—Sb-based alloy is heated (reflowed) and the substrate main body at the time of reflow can be reduced. Thus, even if an external force is exerted to the bonded conductor pins, since the pads strongly adhere to the substrate main body having small warping, the problem such as described in the background art that the substrate main body (glass-ceramic) adjacent to said pads partially peels off together with the conduction pins, solder, and pads can be assuredly prevented. As a result, the conduction with the relay substrate and the like can be assuredly established.

In said pad, without the ceramic constituting said glass-ceramic or Fe converted into $Fe_2O_3$ is less than 1 part by weight with respect to 100 parts by weight of Cu, said chemical adhesion cannot be achieved, and also it becomes impossible to achieve significant reduction in the thermal expansion difference and the sintering shrinking rate difference between the pads and the glass-ceramic constituting the substrate main body.

On the other hand, when the ceramic and Fe converted into $Fe_2O_3$ exceeds 28 parts by weight, the individual effects described above saturate, and the increased amount of ceramic causes poor adhesion of the plating metal or other metal layers to the surface thereof. In addition, the excessively increased amount of Fe enlarges the difference in the sintering shrinking rates of the pads themselves and the sintering shrinking rate of the glass-ceramic constituting the substrate main body, and as a result, the wiring substrate easily warps. For these reasons, the total amount of the ceramic and Fe content converted into $Fe_2O_3$ is defined to the value described above.

Examples of said glass-ceramic include glass-alumina ($Al_2O_3$), glass-silic acid ($SiO_2$), glass-aluminum nitride, glass-zirconium oxide, glass-mulite, and the like.

Alternatively, said pad may be expressed as comprising Cu of 99.30 to 79.2 wt %, $Al_2O_3$ and Fe containing Fe oxide of total 0.70 to 20.8 wt %. Further, examples of Fe oxide include $Fe_2O_3$ and $Fe_3O_4$.

In addition, an average particle diameter of the ceramic contained in said glass-ceramic contained in said pads is 1 to 4 μm. In addition, for said conductor pins, so-called 42 alloy (Fe-42 wt % Ni), that is, 194 alloy (Cu-2.3 wt % Fe-0.03 wt % P), or cobal (Fe-29 wt % Ni-17 wt % Co) and the like is used.

Further, the present invention also includes a wiring substrate wherein said pad is comprised of 4 to 22 parts by weight of ceramic, 1 to 6 parts by weight of Fe converted into $Fe_2O_3$ and 100 parts by weight of Cu.

According to this structure, since said pad is comprised of 4 to 22 parts by weight of ceramic with respect to 100 parts by weight of Cu, chemical adhesion between the pads and the glass-ceramic of the substrate main body can be further assuredly established, and also, the difference in thermal expansions between the pads and the glass-ceramic can be reduced assuredly. For this reason, the stress remaining on the interface between the pads and the glass-ceramic of the substrate main body in the step of reflowing the solder can be reduced.

On the other hand, since said pad contains 1 to 6 parts by weight of Fe converted into $Fe_2O_3$ with respect to 100 parts by weight of Cu, the adhesion between the glass component in the substrate main body and the pads can be enhanced. In addition, the difference in the sintering shrinking rates of the pads and the glass-ceramic of the substrate main body can be reduced, and as a result, the warping of the substrate main body can be assuredly suppressed. Thus, since the pads are strongly adhere to the substrate main body with small warping, even if an external force is exerted to the bonded conductor pins, the problem that the glass-ceramic adjacent to said pads partially peels off together with the conduction pins, solder, and pads can be assuredly prevented. The $Fe_2O_3$ contained in said pads is in 0.7 to 4.2 parts by weight converted into Fe.

Further, the present invention also includes a wiring substrate including:

a substrate main body made of glass-ceramic and having a front surface and a back surface;

a pad formed on at least one of the front surface and the back surface of said substrate main body;

a surface layer pad formed on the front surface of the pad;

a conductor pin provided in an upright position on said pad via solder, wherein said pad is comprised of a ceramic same as that of the ceramic constituting said glass-ceramic, 1 to 28 parts by weight Fe converted into $Fe_2O_3$ and 100 parts by weight of Cu, and wherein said surface layer pad comprises Cu and Fe, where the content of Fe converted into $Fe_2O_3$ is smaller than the content of Fe converted into $Fe_2O_3$ in said pad.

According to this structure, each pad is in a two-layered structure including the pad, and a surface layer pad including Cu formed on the surface of the pad and Fe in an amount relatively smaller than the content of Fe contained in the pad. In addition, the pad in contact with the glass-ceramic of the substrate main body establishes a chemical adhesion with said glass-ceramic, and the difference in the thermal expansions therebetween is small. On the other hand, since the surface layer pad contains Cu and Fe in relatively smaller amount, the adhesion strength between the pad of lower layer and the solder formed on the upper pad (including surface) and reflowed or the plating metal can be enhanced. The content of Fe in the surface layer pad converted into $Fe_2O_3$ is 1 part by weight or less with respect to 100 parts by weight of Cu.

In other words, in the present invention, Ni and Au plating layers are coated onto the surface of said surface layer pad. The wiring substrate is also included therein.

According to this structure, even if various kinds of solders are reflowed on the surface layer pad, generation of iron oxide in said surface layer pad can be suppressed by the two-layered plating layer and the proportion of Cu can be increased. As a result, it becomes possible to facilitate the coating of plating metal.

In other words, a wiring substrate in which the content of ceramic contained in said surface layer pad is smaller than the content of ceramic contained in said pads, or which contains no ceramic may be comprised.

According to this structure, adhesion to the solder or the plating layer formed on the surface of the surface layer pad is enhanced.

BRIEF DESCRIPTION OF THE DRAWINGS

FIG. 9 is a partial cross-sectional view showing a modified embodiment of the wiring substrate described above.

DETAILED DESCRIPTION OF THE PREFERRED EMBODIMENTS OF THE INVENTION

Hereinafter, the best mode for carrying out the present invention will be described.

Figure 1:
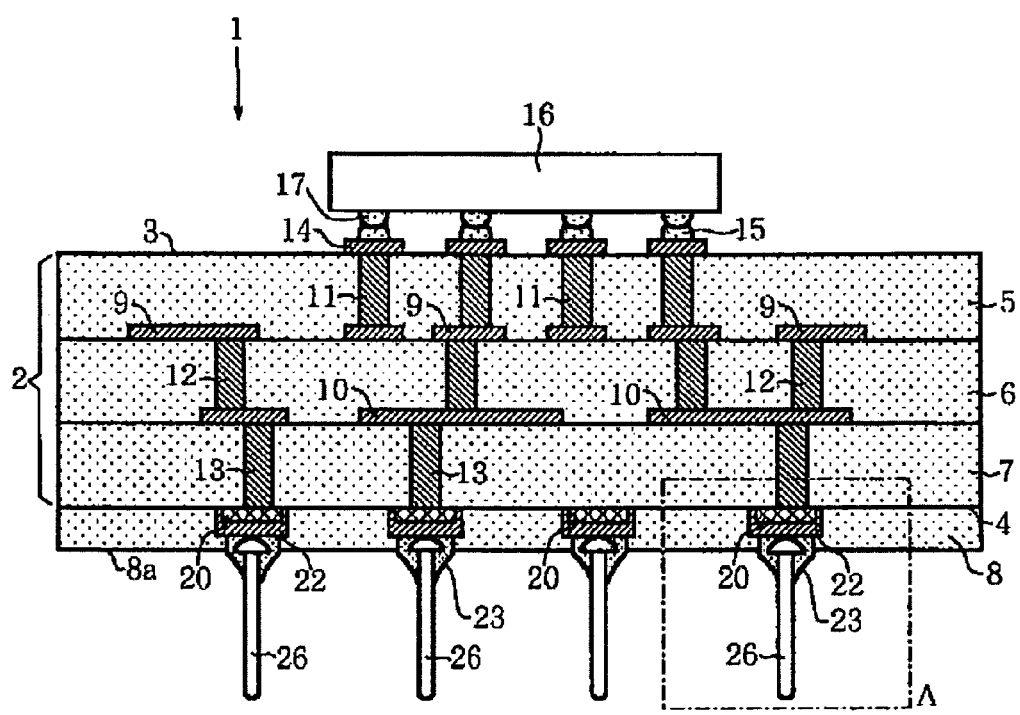
FIG. 1 is a cross sectional view showing a schematic structure of a wiring substrate of the present invention.
Figure 2:
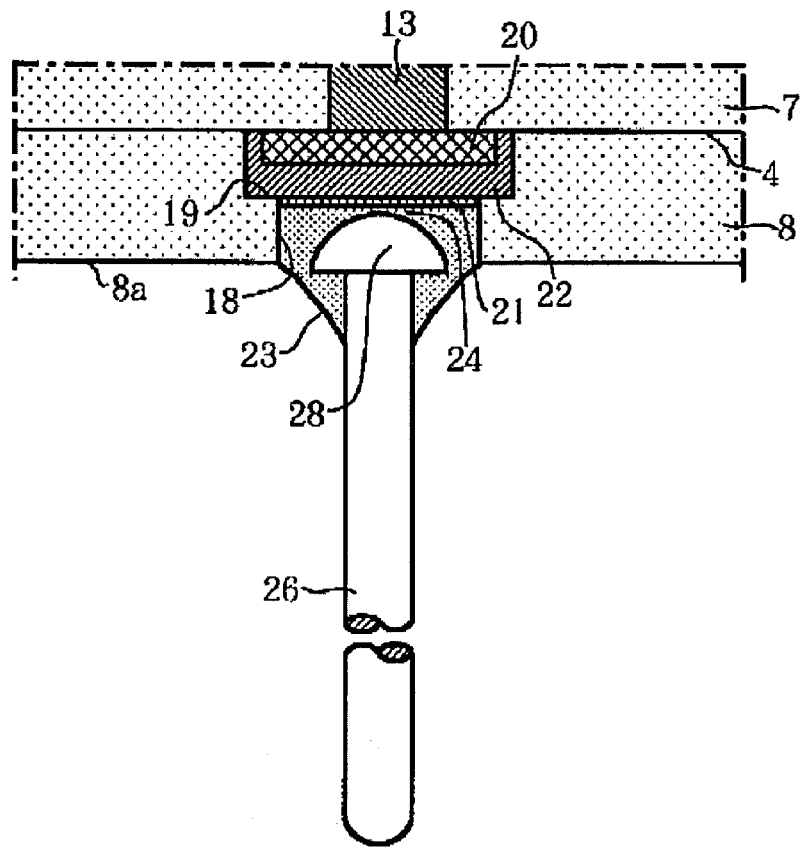
FIG. 2 is a partially enlarged diagram of the portion shown by an alternate long and short dash line in FIG. 1.

FIG. 1 is a cross-sectional diagram showing a wiring substrate 1 of the present invention, and FIG. 2 is a partially enlarged diagram of the portion A shown by an alternate long and short dash line in FIG. 1.

The wiring substrate 1 includes, as shown in FIGS. 1 and 2, a substrate main body 2 having a front surface 3 and a back surface 4, a plurality of pads 20 formed on the back surface 4 of the substrate main body 2, a plurality of surface layer pads 22 each formed on the surface of each pad 20, and a conductor pin 26 made of, for example, 194 alloy provided in an upright position on the outer surface side of each surface layer pad 22 (downward in the drawings) via solder 23.

The substrate main body 2 is made of insulating layers 5 to 7 made of glass (ceramic) and laminated into one piece unit.

In addition, each pad 20 is made of a metal-ceramic composite material which contains Cu, $Al_2O_3$ particles having an average particle diameter of 1 to 4 μm and being the same ceramic as the ceramic constituting said glass-ceramic, and Fe oxide containing $Fe_2O_3$. The metal-ceramic composite is obtained by mixing 4 to 22 parts by weight of $Al_2O_3$ with 1 to 6 parts by weight of Fe converted into $Fe_2O_3$ with respect to 100 parts by weight of Cu.

Further, each surface layer pad 22 contains Cu and $Fe_2O_3$, where 1 part by weight or less of $Fe_2O_3$ is mixed with 100 parts by weight of Cu. In addition, the solder 23 is made of Sn—Sb-based alloy having a low melting point and reflowable at about 250° C.

As shown in FIGS. 1 and 2, wiring layers 9, 10 made of Cu are formed between the insulating layers 5 and 6, and between 6 and 7 of the substrate main body 2 respectively. A plurality of connection pads 14 made of Cu is formed on the front surface 3 of the substrate main body 2. The plurality of connection pads 14 are connected with the pads 20 formed on the back surface 4 by via conductors 11 to 13 made of Cu. The composition of the via conductor 13 and the composition of the pad 20 may be different from each other.

On the back surface 4 of the substrate main body 2, a coating layer 8 made of (over-coating) glass is formed into a desired thickness. On the coating layer 8, opening edges 19 of through holes 18 cover the outer peripheral portions of said pads 20 and said surface layer pads 22. The coating layer 8 is made of glass containing silic acid, and plurality of through holes 18 are opened on a surface 8a thereof.

For the coating layer 8 made of glass, a glass-alumina composite material having the same components as of the substrate main body 2 and further mixed with color powder (pigment) such as Cr, Mn, or Fe may be used.

As shown in FIGS. 1 and 2, a hemispherical nail head portion 28 of the conductor pin 26 faces the surface layer pad 22 via the solder 23. The solder 23 fills the space between the nail head portion 28 and a plating layer 21. The plurality of conductor pins 26 is used for connecting the wiring substrate 1 itself to an unillustrated relay substrate or a surface electrode on a mother board.

The plating layer 21 is coated onto the outer surface of the surface layer pad 22. The plating layer 21 is made of two plating layers, that is, an Ni plating layer having a thickness of 2 to 5 μm and an Au plating layer having a thickness of about 0.02 to 0.3 μm. The surface of each conductor pin 26 and the solder 23 may also be respectively covered with an Ni plating layer and an Au plating layer.

By the way, the size of the substrate main body 2 is 51 mm×51 mm×2 mm in thickness. The thickness of the coating layer 8 made of glass is about 20 μm. The diameter of each conductor pin 26 is 0.3 mm, and the maximum diameter of the nail head portion 28 thereof is 0.65 mm.

As shown in FIG. 1, an external electrode 17 provided on the bottom surface of an IC chip (i.e. an electronic part) 16 is connected to the plurality of connection pads 14 located on the front surface 3 of the substrate main body 2 via solder 15 made of an alloy having a melting point lower than that of the solder 23 (for example, 96.5 wt % Sn-3.5 wt % Ag). In this manner, the IC chip 16 is mounted onto the front surface 3 of the substrate main body 2.

According to the wiring substrate 1 such as described above, the content of $Al_2O_3$ is reduced stepwise in the order of the glass-ceramic of the substrate main body 2, the pads 20, and the surface layer pads 22. Thus, individual chemical adhesion between the back surface 4 made of glass-ceramic and the pads 20 and between the pads 20 and the surface layer pads 22, which are adjacent to each other respectively, is enhanced. Simultaneously, the differences in thermal expansions among the substrate main body 2, the pads 20, the surface layer pads 22, and the solder 23 can be suppressed to be small. On the other hand, since the Fe component containing $Fe_2O_3$ is contained in the pads 20, the adhesion strength between the glass component in the substrate main body 2 and the pads 20 is enhanced, and the difference in sintering shrinking rates of the glass-ceramic of the substrate main body 2 and the pads 20 becomes small. Thus, the warping of the substrate main body can be suppressed.

As a result, the conduction between the wiring layers 9, 10 and the surface layer pads 22 can be established assuredly via the via conductors 11 to 13. Further, since the substrate main body 2 and the pads 20 strongly adhere to each other at their interfaces, it is possible to prevent the pads 20, the surface layer pads 22, and the coating layer 8 adjacent to them partially peel off and the conductor pins 26 unintentionally come off by an external force together with the pads 20, the surface layer pads 22, and the coating layer 8.

In addition, because the coating layer 8 is made of glass and is formed in such a manner that it covers the outer peripheral portions of the pads 20 and the surface layer pads 22, the coating layer 8 physically adheres to the glass-ceramic side of the substrate main body 2. Therefore, according to thus-structured wiring substrate 1, conduction with the printed circuit board such as a mother board can be established via the conductor pins 26, and the IC chip 16 can be mounted onto the front surface 3.

Hereinafter, a method for manufacturing the wiring substrate 1 will be described.

Beforehand, a plurality of glass-ceramic green sheets is prepared. Such green sheets are prepared by mixing $SiO_2$—$B_2O_3$—$Al_2O_3$-based glass powder, ceramic powder as a filler, an organic binder, a plasticizer, an organic solvent, and the like with each other.

As a glass component of the glass power other than that described above, $SiO_2$—$B_2O_3$—$Al_2O_3$—MO-based (where M means Ca, Sr, Mg, Ba, or Zr), PB-based glass, Bi-based glass, or the like may be alternatively used.

Further, as the ceramic powder described above, for example, a composite oxide of $Al_2O_3$—$SiO_2$—$ZrO_2$ and an alkaline rare earth metal oxide, a composite oxide of $TiO_2$ and an alkaline rare earth metal oxide, and a composite oxide containing at least one selected from $Al_2O_3$ and $SiO_2$, for example, spinel, mulite cordierite, and the like may be used.

The glass powder and the ceramic powder are mixed with each other at the weight ratio of 40:60 to 60:40.

Further, examples of the organic binder to be blended with the green sheets include, for example, acryl-based, polyvinyl butyral-based, polyvinyl alcohol-based, acryl-styrene-based, polypropylene carbonate-based, or cellulose-based single polymers or copolymers.

The green sheet can be obtained in the following steps. That is, the glass powder, ceramic powder, and organic binder described above are mixed with each other, and if necessary, a plasticizer in a desired amount and a solvent (i.e. an organic solvent or water) are further added thereto so as to prepare slurry. The resultant slurry is formed into the shape of sheet in the thickness of several tens to several hundreds μm by a method such as doctor blade, metal rolling, calendar rolling, mold pressing, or the like.

On at least one of the front surface and the back surface of each of the plurality of thus-obtained glass-ceramic green sheets, conductive paste containing Cu particles is printed to form a predetermined pattern by screen printing and the like. Simultaneously, the via holes penetrating through each green sheet are also filled with said conductive paste.

Figure 3:
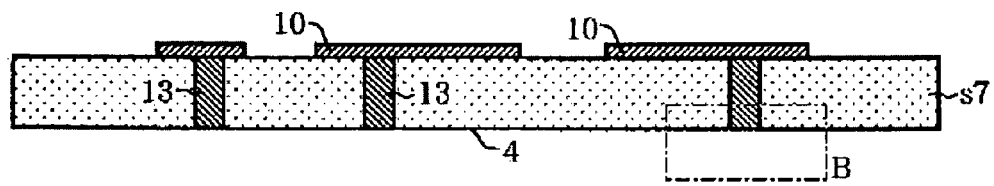
FIG. 3 is a schematic diagram showing manufacturing steps for obtaining the wiring substrate described above.

As a result, as is exemplified in FIG. 3, green sheets s7 are obtained. In a later step, each green sheet s7 will be employed as the insulating layer 7 described above which has an inside wiring layer 10 and a via conductor 13.

Figure 4:
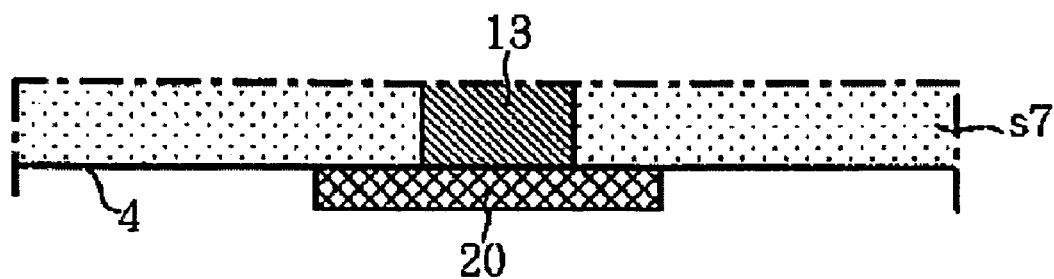
FIG. 4 is a partially enlarged diagram of the portion B shown by an alternate long and short dash line in FIG. 3 in a manufacturing step subsequent to FIG. 3.

Next, as shown in FIG. 4 illustrating the portion B shown by the alternate long and short dash line of FIG. 3 in an enlarged manner, a plurality of pads 20 each having a thickness of about 20 μm is formed by screen printing and the like at predetermined positions on the back surface 4 of the green sheet s7. Each of thus-formed pad 20 is made of a mixed material containing Cu, $Al_2O_3$ particles, and $Fe_2O_3$, where 4 to 22 parts by weight of $Al_2O_3$, 1 to 6 parts by weight of Fe converted into $Fe_2O_3$ are mixed with respect to 100 parts by weight of Cu.

Figure 5:
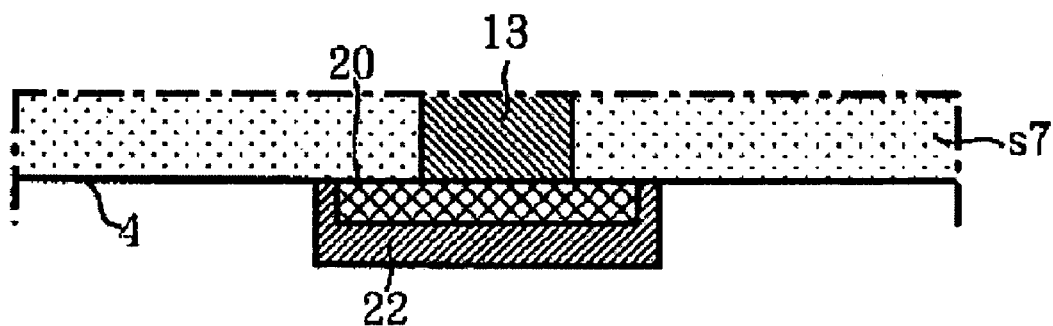
FIG. 5 is a schematic diagram showing a manufacturing step subsequent to FIG. 4.

Further, as shown in FIG. 5, on the surface of each pad 20, a surface layer pad 22 is formed into a thickness of about 15 μm by screen printing. Thus-formed surface layer pad 22 contains Cu and $Fe_2O_3$, where 1 part by weight or less of $Fe_2O_3$ is mixed with respect to 100 parts by weight of Cu. As compared with the pad 20, in the surface layer pad 22, the content of Cu is larger and the content of $Fe_2O_3$ is smaller. Thus, when the surface layer pad 22 is formed on the back surface 4 of the green sheet s7 including the end surface of the via conductor 13 and the pad 20, the surface layer pad 22 is more strongly bonded as compared with the case where such a surface layer pad 22 is formed directly onto the back surface 4.

Figure 6:
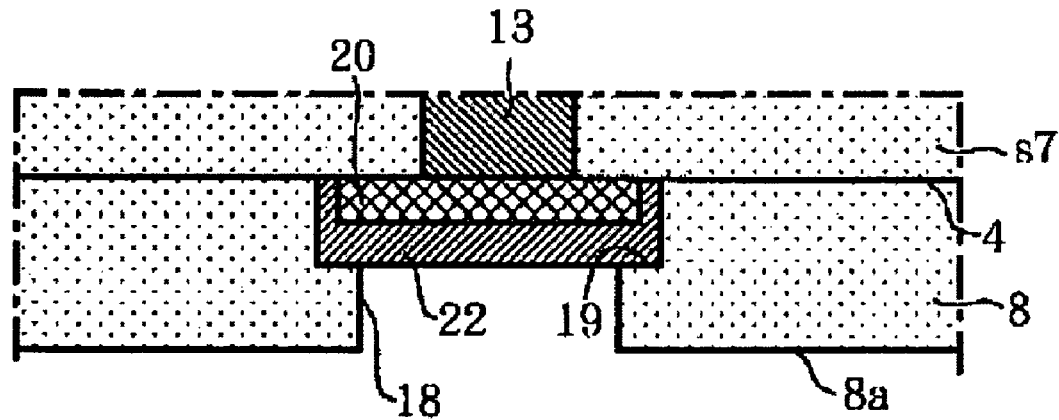
FIG. 6 is a schematic diagram showing a manufacturing step subsequent to FIG. 5.

Subsequently, a predetermined masking (not shown) is provided to enclose the outer peripheral portions of the pad 20 and the surface layer pad layer 22. Then, as shown in FIG. 6, a coating layer 8 made of soft glass containing said glass component is formed onto the back surface 4 of the substrate main body 2 by a method such as application coating. After the coating layer 8 has solidified, as shown in FIG. 6, an opening edge 19 of a through hole 18 that opens on the surface 8a of the coating layer 8 made of glass, defines a shape that covers the outer peripheral portions of the pad 20 and the surface layer pad 22.

In this state, a green sheet s7 containing the coating layer 8 and the green sheets which will be the insulating layers 5, 6 in a later step are laminated on each other. The resultant laminated body is heated to a temperature range of, for example, 100 to 800° C. to remove the organic components of the organic binder and the like. After that, the laminated body is further heated to a temperature range of about 800 to 1000° C. so as to be sintered.

Figure 7:
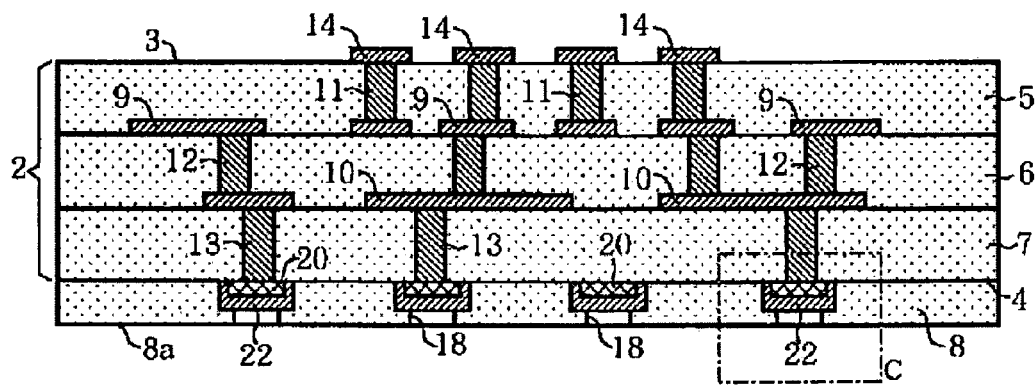
FIG. 7 is a schematic diagram showing a manufacturing step subsequent to FIG. 6.

As a result, as shown in FIG. 7, a substrate main body 2 is obtained. The substrate main body is made of glass-ceramic insulating layers 5 to 7, and includes inside wiring layers 9, 10 and via conductors 11 to 13 inside the substrate main body, and connection pads 14 formed on the front surface 3 thereof, and a coating layer 8 formed on the back surface 4 thereof.

Figure 8:
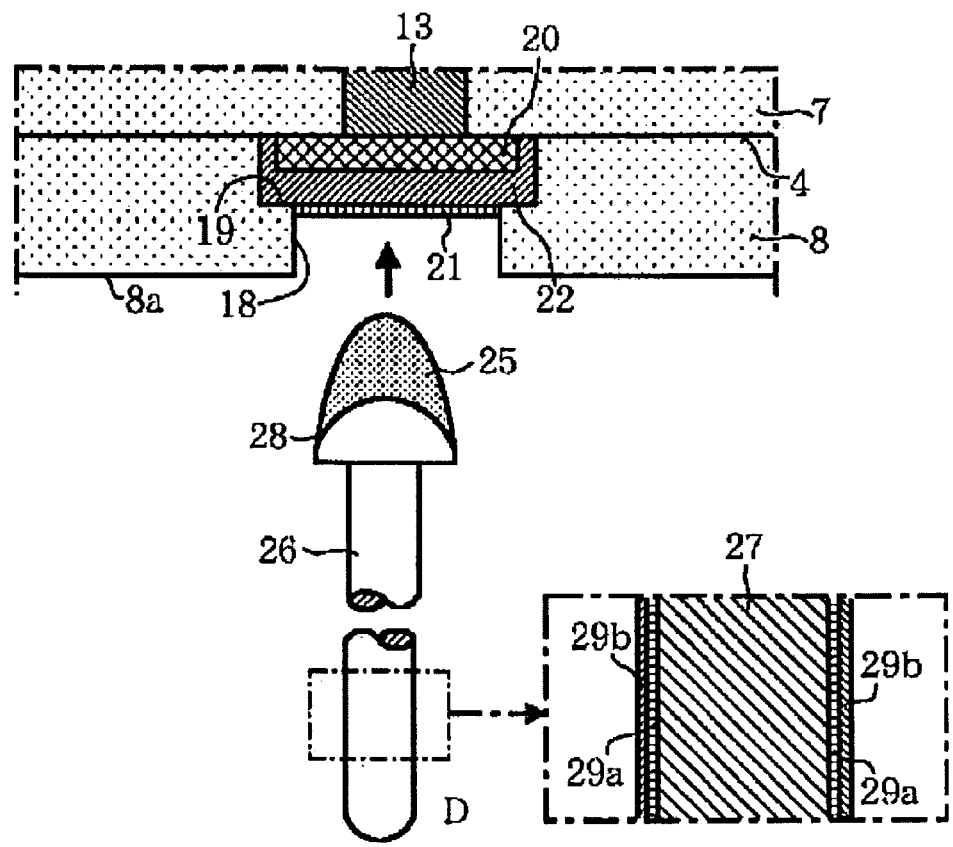
FIG. 8 is a partially enlarged diagram of the portion C shown by an alternate long and short dash line in FIG. 7 in a manufacturing step subsequent to FIG. 7.

Next, as shown in FIG. 8 illustrating the portion C shown by the alternate long and short dash line of FIG. 7 in an enlarged manner, a double-layered plating layer 21 including an Ni plating layer having a thickness of 2 to 5 μm and an Au plating layer having a thickness of about 0.02 to 0.3 μm is coated onto the surface of said surface layer pad 22.

Further, as shown by an arrow in FIG. 8, a conductor pin 26 made of, for example, 194 alloy is inserted into the surface of the surface layer pad 22 exposed from the coating layer 8 made of glass, or into a through hole 18 through which the plating layer 21 is exposed in such a manner that the nail head portion 28 of the conductor pin 26 faces to the front layer pad 22. The upper surface of the nail head portion 28 is formed with solder 25 made of Sn—Sb-based alloy having a melding point of about 230° C. into a generally hemispherical shape beforehand.

The solder 25 is heated (reflowed) at the temperature slightly higher than the melting point thereof in a state where the solder 25 and the surface layer pad 22 or the plating layer 21 are in contact with each other, and an axial center of the conductor pin 26 is kept at a right angle on the back surface 4 of the substrate main body 2.

As a result, the solder 25 starts to melt and then, as shown in FIG. 2, solidifies into a substantially conical solder 23 (See FIG. 1) which encloses the nail head portion 28 of the conductor pin 26 involving the gap 24 between the plating layer 21 and the nail head portion 28. Thus, the conductor pin 26 can be provided in an upright position on the back surface 4 of the substrate main body 2 via the solder 23.

Then, Ni and Au are plated onto the surfaces of the conductor pin 26 and the solder 23. As a result, as shown in FIG. 8 illustrating the partial surface of the portion D shown by the alternate long and short dash line of FIG. 8 in an enlarged manner, the surface of the pin main body 27 is coated with the Ni plating layer 29a having a thickness of 3 to 7 μm and the Au plating layer 29b having a thickness of about 0.02 to 0.3 μm. Thus-formed Au plating layer 29b assures a corrosion resistance of the conductor pin 26 and the solder 23.

As a result of the individual steps described above, the wiring substrate 1 shown in FIGS. 1 and 2 can be obtained.

Further, in order to mount an IC chip 16 onto the front surface 3 of the substrate main body 2, the solder 15 is heated (reflowed) to the temperature near its melding point in a state where an external electrode 17 provided on the bottom surface of the IC chip 16 is mounted onto the plurality of connection pads 14 located on the front surface 3 via the solder 15 made of Sn—Ag-based alloy having a low melting point than that of the solder 23.

The step of coating the plating layer 21 onto the surface of the surface layer pad 22 may be omitted.

FIG. 9 is a partial cross-sectional view of a wiring substrate 1a according to a modified embodiment of the wiring substrate 1. As is the case of the wiring substrate 1, the wiring substrate 1a includes a substrate main body 2 incorporating the wiring layers 9, 10, the via conductors 11 to 13 same as those described above, and a coating layer 8 same as that described above on its back surface 4. On the back surface 4 of the substrate main body 2, a plurality of pads 20 having a relatively large thickness as of the foregoing embodiment is formed, and each outer peripheral portion thereof is covered with an opening edge 19 of a through hole 18 that is formed in the coating layer 8.

As shown in FIG. 9, on the wiring substrate 1a, the surface of each pad 20 is covered with a plating layer 21. A nail head portion 28 of a conductor pin 26 is soldered to the pad 20 and the outer surface side (downward in FIG. 9) of the plating layer 21 via the solder 23.

Specifically, the wiring substrate 1a has the same structure as of the wiring substrate 1 of the foregoing embodiment, except that the surface layer pad 22 is omitted. In this structure, there may be a case where the adhesion of the plating layer 21 to the surface of each pad 20 becomes relatively poorer than the case of the wiring substrate 1 described above.

According to the wiring substrate 1a described above, adhesion strength of the same level as of the wiring substrate 1 can be achieved between the glass-ceramic of the substrate main body 2 and each pad 20, and the conductor pin 26 can be strongly bonded to each pad 20 and the plating layer 21 via the solder 23.

Here, the results obtained from confirming the effect of the present invention are shown.

Glass powder made of $SiO_2$—$B_2O_3$—$Al_2O_3$-based glass, ceramic powder of a filler made of a composite oxide of $Al_2O_3$—$SiO_2$—$ZrO_2$ and an alkaline rare earth metal oxide, acryl-based organic binder, a plasticizer, and an organic solvent were mixed with each other so as to prepare slurry. The glass powder and the ceramic powder were mixed with each other at the ratio of 50 parts by weight: 50 parts by weight. The resultant slurry was formed into a plurality of green sheets having the thickness of 300 μm and the length and width of are identical to each other by doctor blade method.

On the back surface of each green sheet at the same positions, a plurality of pads 20 each having a thickness of 20 μm was formed by screen printing. Each pad 20 contained Cu, $Al_2O_3$ particles, and $Fe_2O_3$, where the contents of Cu, $Al_2O_3$, and Fe($Fe_2O_3$) were changed as shown in Table 1 for each substrate main body 2 with respect to 100 parts by weight of Cu. 10 pieces were prepared for each sample.

On the surface of each pad 20 of samples Nos. 5 to 8, a surface layer pad 22 having a thickness of 15 μm was formed by screen printing. Thus-formed surface layer pad 22 contained Cu and $Fe_2O_3$, where 1 part by weight of $Fe_2O_3$ was mixed with 100 parts by weight of Cu.

In this state, the same green sheet as of the above was laminated onto each green sheet. The obtained laminated body was heated to the temperature range of about 250° C. to remove an organic component such as the organic binder described above. Then, the laminated body was further heated and sintered to the temperature range of about 1000° C. so as to prepare a plurality of substrate main bodies 2.

Next, a doubled-layered plating layer, including an Ni plating layer having a thickness of 5 μm and an Au plating layer having a thickness of 0.1 μm is coated onto the surface of the surface layer pad 22 or the pad 20 of each substrate main body 2.

Next, an external terminal 26 made of 194 alloy was inserted into each through hole 18 onto the surface layer pad 22 or the pad 20 exposed on the bottom surface 8a of each substrate main body 2 through which the plating layer 21 is exposed on its bottom surface in such a manner that the curved surface of the nail 28 is faced to the surface layer pad 22. Beforehand, the curved surface of each nail 28 is formed with solder 25 made of Sn—Sb-based alloy having a melting point of about 230° C. into a generally hemispherical shape.

Further, the solder 25 was heated (reflowed) to near the temperature (240° C.) slightly higher than the melting point thereof in a state where the solder 25 and the surface layer pad 22 or the said plating layer 21 are in contact with each other, and an axial center of the conductor pin is kept at a right angle on the back surface 8a of the substrate main body 2.

TABLE 1

| Sample No. | Cu (weight %) | $Al_2O_3$ (weight %) | $Fe_2O_3$ (weight %) | Results |
|---|---|---|---|---|
| 1 | 100 | 0 | 0.5 | X |
| 2 | 100 | 0 | 1 | X |
| 3 | 100 | 3 | 1 | ○ |
| 4 | 100 | 4 | 1 | ○ |
| 5 | 100 | 12 | 2 | ○ |
| 6 | 100 | 12 | 4 | ○ |

TABLE 1-continued

| Sample No. | Cu (weight %) | $Al_2O_3$ (weight %) | $Fe_2O_3$ (weight %) | Results |
|---|---|---|---|---|
| 7 | 100 | 12 | 6 | ○ |
| 8 | 100 | 22 | 6 | ○ |
| 9 | 100 | 22 | 8 | ▲ |
| 10 | 100 | 25 | 10 | ▲ |

The results of a test in which the external terminal 26 of each example was pulled at a constant speed in a direction inclined at 45 degrees with respect to the axial center of an axial portion are shown in Table 1. In Table 1, the contents of Cu, Al, and Fe were values obtained by measuring the cross section of each pad 20 by fluorescence x-ray analysis (EDS) apparatus and then converted into oxides. In Table 1, the samples in which no peeling occurred between the pad 20 and the substrate main body 2 even after the tensile strength exceeded 20N are marked with ○, and the samples in which the substrate main body 2 warped after the sintering step are marked with ▲, and the samples in which peeling occurred between even one pad 20 and the substrate main body 2 are marked with x.

According to Table 1, Samples Nos. 3 to 8 exhibited neither cracks nor peeling at the interface between the substrate main body 2 and the pads 20. It is believed that the reason for this result is that the presence of $Al_2O_3$ in the pads 20 provides chemical adhesion between the pads and the glass-ceramic of the substrate main body and that the adhesion between the glass component and the pads is enhanced because the iron oxide such as $Fe_2O_2$ diffused within the substrate main body.

On the other hand, Samples 1 and 2 exhibited cracks and peeling at the interface between the substrate main body 2 and the pads 20 at the tensile strength of 20N or smaller. It is believed that the reason for this result is that, since no $Al_2O_3$ was contained in the pads 20, there was no chemical adhesion between the pads 20 and the substrate main body 2, and the difference in the thermal expansions between the pads 20 and the substrate main body 2 became large and residual stress was created.

Further, Samples 9 and 10 exhibited warping on their substrates after the sintering step. It is believed that the reasons for these results are as follows. As to Sample 9, since the content of Fe was high, the difference in sintering shrinking rates between the pads 20 and the substrate main body 2 became large accordingly. As to Sample 10 as well, since the contents of $Al_2O_3$ and Fe were excessively high, the difference in sintering shrinking rates between the pads 20 and the substrate main body 2 became large.

The results of Examples 3 to 8 described above have supported the effect of the present invention.

The present invention is not limited to the embodiments described above.

Alternatively, for example, the blending ratio of Cu, $Al_2O_3$, and Fe in each pad 20 maybe properly selected within the above-described range.

Further, the pads 20 and the surface layer pads 22 may be formed on only the surface of the substrate main body 2, and on thus-formed substrate, the conductor pins 26 may be provided in an upright position via the solder 23. Alternatively, the conductor pins 26 may be provided in an upright position on both of the front surface 3 and the back surface 4 of the substrate main body 2.

Further, the substrate main body 2 may be formed with a cavity which opens at the front surface 3 thereof. In this structure, an electronic part of said IC chip 16 and a light emitting element such as light emitting diode can be assuredly mounted on the bottom surface of the cavity.

Further, the solder 25 (23) may contain Sn—Zn based or Sn—Cu-based alloy having low melting point, instead of Sn—Sb-based alloy.

In addition, the material of the conductor pin 26 is not limited to 194 alloy, but alternatively, cobal or 42 alloy may be used. The nail head portion 28 thereof may be in the shape of flat circular column.

What is claimed is:

1. A wiring substrate comprising:
    a substrate main body made of a glass-ceramic comprising $Al_2O_3$ ceramic, and having a front surface and a back surface;
    a pad formed on at least one of the front surface and the back surface of said substrate main body; and
    a conductor pin provided in an upright position on said pad via solder, wherein said pad is comprised of:
        a ceramic that is the same as the $Al_2O_3$ ceramic of said glass-ceramic;
        Fe converted into $Fe_2O_3$; and
        Cu said $Fe_2O_3$ comprising 1 to 28 parts by weight with respect to 100 parts by weight of said Cu.

2. A wiring substrate according to claim 1, wherein said pad is comprised of:
    4 to 22 parts by weight of said ceramic;
    1 to 6 parts by weight of said Fe converted into $Fe_2O_3$; and
    100 parts by weight of said Cu.

3. A wiring substrate comprising:
    a substrate main body made of a glass-ceramic comprising $Al_2O_3$ ceramic, and having a front surface and a back surface;
    a pad formed on at least one of the front surface and the back surface of said substrate main body;
    a surface layer pad formed on the front surface of said pad; and
    a conductor pin provided in an upright position on said surface layer pad via solder,
    wherein said pad is comprised of a ceramic that is the same as the $Al_2O_3$ ceramic of said glass-ceramic, Fe converted into $Fe_2O_3$, and Cu, said $Fe_2O_3$ comprising 1 to 28 parts by weight with respect to 100 parts by weight of said Cu, and
    wherein said surface layer pad is comprised of Cu and Fe, wherein the content of Fe converted into $Fe_2O_3$ in said surface layer pad is less than the content of Fe converted into $Fe_2O_3$ in said pad.

4. A wiring substrate according to claim 3, wherein said pad is comprised of:
    4 to 22 parts by weight of said ceramic and;
    1 to 6 parts by weight of Fe converted into $Fe_2O_3$; and
    100 parts by weight of Cu.

5. A wiring substrate according to claim 3, wherein the content of the ceramic contained in said surface layer pad is less than the content of the ceramic contained in said pad.

6. A wiring substrate according to claim 4, wherein the content of the ceramic contained in said surface layer pad is less than the content of the ceramic contained in said pad.

7. A wiring substrate according to claim 3, wherein said surface layer pad does not contain ceramic.

8. A wiring substrate according to claim 4, wherein said surface layer pad does not contain ceramic.

* * * * *